(12) United States Patent
Muchherla et al.

(10) Patent No.: US 11,755,472 B2
(45) Date of Patent: *Sep. 12, 2023

(54) PERIODIC FLUSH IN MEMORY COMPONENT THAT IS USING GREEDY GARBAGE COLLECTION

(71) Applicant: Micron Technology, Inc., Boise, ID (US)

(72) Inventors: Kishore Kumar Muchherla, Fremont, CA (US); Peter Sean Feeley, Boise, ID (US); Sampath K. Ratnam, Boise, ID (US); Ashutosh Malshe, Fremont, CA (US); Christopher S. Hale, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/375,478

(22) Filed: Jul. 14, 2021

(65) Prior Publication Data

US 2021/0342262 A1 Nov. 4, 2021

Related U.S. Application Data

(63) Continuation of application No. 16/175,005, filed on Oct. 30, 2018, now Pat. No. 11,106,577.

(51) Int. Cl.
*G06F 12/128* (2016.01)
*G06F 12/02* (2006.01)
*G06F 12/0897* (2016.01)

(52) U.S. Cl.
CPC ...... *G06F 12/0253* (2013.01); *G06F 12/0246* (2013.01); *G06F 12/0897* (2013.01); *G06F 12/128* (2013.01)

(58) Field of Classification Search
CPC .... G06F 3/0679; G06F 3/0659; G06F 3/0688; G06F 3/061; G06F 3/064;
(Continued)

(56) References Cited

U.S. PATENT DOCUMENTS 5,530,850 A 6/1996 Ford et al.
8,341,339 B1 * 12/2012 Boyle ............... G06F 3/0685
711/112

(Continued)

FOREIGN PATENT DOCUMENTS

KR 20140113212 A 9/2014

OTHER PUBLICATIONS

Wen-Huei Lin et al: "Dual greedy", Design, Automation and Test in Europe, EDA Consortium, 111 West Saint John Street, Suite 220 San Jose CA 95113 USA, Mar. 12, 2012, pp. 117-1222, XP058021571, DOI: 10.1109/DATE.2012.6176443 ISBN: 978-3-9810801-8-6 (Year: 2012).*

(Continued)

*Primary Examiner* — Titus Wong
(74) *Attorney, Agent, or Firm* — Lowenstein Sandler LLP

(57) ABSTRACT

A method includes identifying a first block of a plurality of blocks stored at a first memory based on an amount of valid data of the first block, and writing the valid data of the first block from the first memory to a second memory. The first memory has a first memory type and the second memory has a second memory type different from the first memory type. The method further includes identifying a second block of the plurality of blocks stored at the first memory based on an age of valid data of the second block, determining that the age of the valid data of the second block satisfies a threshold condition, and in response to determining that the age of the valid data of the second block satisfies the threshold con-
(Continued)

dition, writing the valid data of the second block from the first memory to the second memory.

20 Claims, 5 Drawing Sheets

(58) Field of Classification Search
CPC ..... G06F 2212/7205; G06F 2212/7208; G06F 2212/7211
USPC ........................................................ 711/156
See application file for complete search history.

(56) References Cited

U.S. PATENT DOCUMENTS

| | | | |
|---|---|---|---|
| 8,966,205 B1* | 2/2015 | Lo | G06F 12/0246 711/165 |
| 10,126,958 B2* | 11/2018 | Ramalingam | G06F 3/0647 |
| 2009/0327591 A1* | 12/2009 | Moshayedi | G06F 3/0688 711/E12.001 |
| 2011/0055455 A1* | 3/2011 | Post | G06F 12/0246 711/E12.001 |
| 2011/0264843 A1 | 10/2011 | Haines et al. | |
| 2012/0297121 A1* | 11/2012 | Gorobets | G06F 12/0246 711/E12.008 |
| 2013/0282955 A1 | 10/2013 | Parker et al. | |
| 2014/0032817 A1 | 1/2014 | Bux et al. | |
| 2014/0281338 A1* | 9/2014 | Choi | G06F 3/0688 711/170 |
| 2016/0179386 A1* | 6/2016 | Zhang | G06F 3/0679 711/103 |
| 2016/0188219 A1 | 6/2016 | Peterson et al. | |
| 2017/0242790 A1* | 8/2017 | O'Krafka | G06F 3/0679 |

OTHER PUBLICATIONS

PCT International Search Report and Written Opinion for International Application No. PCT/US2019/058657, dated Feb. 14, 2020, 11 pages.
PCT Notification Concerning Transmittal of International Preliminary Report on Patentability for PCT Application No. PCT/US2019/058657, dated May 14, 2021, 8 pages.
USPTO, Office Action for U.S. Appl. No. 16/175,005, dated Aug. 5, 2020.
USPTO, Final Office Action for U.S. Appl. No. 16/175,005), dated Feb. 1, 2021.
USPTO, Advisory Action for U.S. Appl. No. 16/175,005, dated Apr. 6, 2021.
USPTO, Notice of Allowance for U.S. Appl. No. 16/175,005, dated Apr. 21, 2021.
Wen-Huei Lin et al.: "Dual greedy", Design, Automation and Test in Europe, EDA Consortium, 111 West Saint John Street, Suite 220 San Jose CA 95113 USA, Mar. 12, 2012 (Mar. 12, 2012), pp. 117-122, XP058021571, DOI: 10.1109/DATE.2012.6176433; ISBN: 978-3-9810801-8-6.
The extended European search report for EP Application No. 19877882.1, dated Jul. 1, 2022, 11 pages.

* cited by examiner

PERIODIC FLUSH IN MEMORY COMPONENT THAT IS USING GREEDY GARBAGE COLLECTION

RELATED APPLICATION

The present Application is a Continuation of U.S. patent application Ser. No. 16/175,005, filed on Oct. 30, 2018, entitled "PERIODIC FLUSH IN MEMORY COMPONENT THAT IS USING GREEDY GARBAGE COLLECTION", which is incorporated herein by reference in its entirety for all purposes.

TECHNICAL FIELD

Embodiments of the disclosure relate generally to memory sub-systems, and more specifically, relate to periodically flushing a memory component that is using a greedy garbage collection technique.

BACKGROUND

A memory sub-system can be a storage system, such as a solid-state drive (SSD), and can include one or more memory components that store data. The memory components can be, for example, non-volatile memory components and volatile memory components. In general, a host system can utilize a memory sub-system to store data at the memory components and to retrieve data from the memory components.

BRIEF DESCRIPTION OF THE DRAWINGS

The present disclosure will be understood more fully from the detailed description given below and from the accompanying drawings of various embodiments of the disclosure.

DETAILED DESCRIPTION

Figure 1:
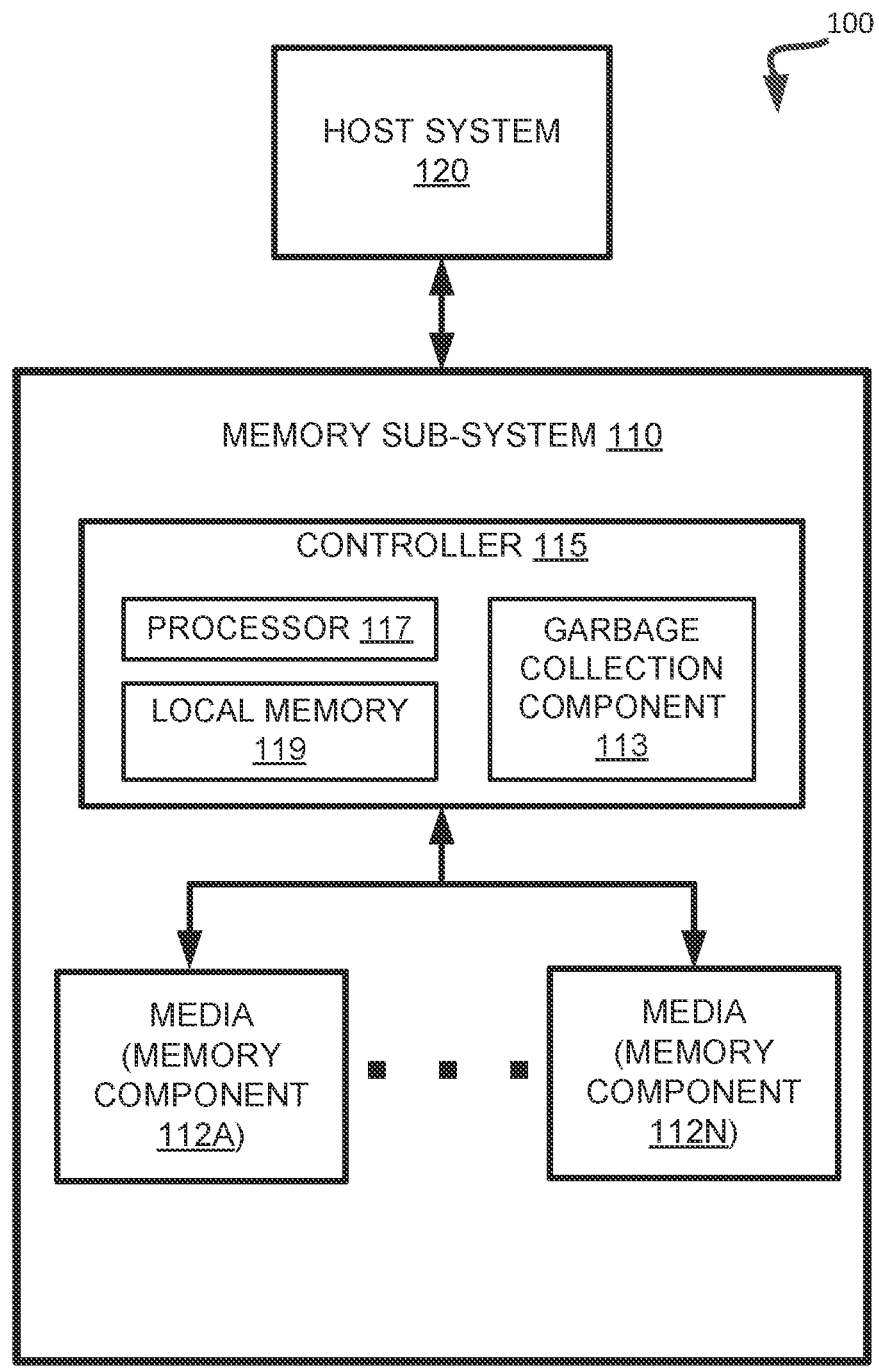
FIG. 1 illustrates an example computing environment that includes a memory sub-system in accordance with some embodiments of the present disclosure.

Aspects of the present disclosure are directed to periodically flushing a memory component that is using greedy garbage collection. A memory sub-system is also hereinafter referred to as a "memory device." An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system.

The memory sub-system can include multiple memory components that can store data from the host system. Each memory component can include a different type of media. Examples of media include, but are not limited to, a cross-point array of non-volatile memory and flash based memory such as single-level cell (SLC) memory, triple-level cell (TLC) memory, and quad-level cell (QLC) memory.

A conventional memory sub-system can employ a greedy garbage collection operation to relocate data from an SLC cache (also referred to as a static cache herein) to a data block having a different memory type. In flash-based memory sub-systems using two pass programming, power loss while programming during a second pass can result in data loss on a page that was programmed during a first pass. In this case, systems may write the data in SLC mode and then relocate the data to MLC or TLC or QLC. Relocating data from a first data block to a second data block and erasing the data from the first data block can be referred to as garbage collection herein. A greedy garbage collection operation can refer to an operation that relocates valid data from a first data block to a second data block based on an amount of valid data stored at the first data block. Valid data can refer to data successfully written to a data block and the data has not been erased, indicated to be erased, updated, or re-programmed by a host system. Thus, valid data can be data that is presently used by the host system and invalid data can be data that is no longer used by the host system.

The greedy garbage collection operation can select to garbage collect valid data at a data block having a least amount of valid data relative to the other data blocks of the memory component. For example, if one data block has 5% valid data and another data block of a memory component has 10% valid data, the data block having the 5% valid data will be selected for the greedy garbage collection operation and the valid data and invalid data at the data block can be erased by the greedy garbage collection operation. Subsequently, the data block can be used to store additional host data. One rationale for selecting the data block having the least amount of valid data for garbage collection is that relocating a lesser amount of valid data can take less time and utilize less computing resources as compared to relocating a larger amount of valid data at a data block. The garbage collection process can be executed in the background during idle time or when the data blocks of a SLC cache are each storing at least some valid data.

In some instances, longer data dwell lengths can return the least amount of valid data. Data dwell length can refer to the amount of data that is written to the SLC cache from when the data block was written with data to when that data block is garbage collected. Larger dwell length results in the least amount of valid data because host write traffic can include hot data that is immediately over-written by data subsequently written. A larger dwell length implies that a large amount of host data is written between when the block was initially written and when the block is garbage collected. This increases the probability of host data being over-written before it is garbage collected. The maximum dwell length could converge to the size of SLC cache. For example, for a memory component with a 6 gigabyte (GB) SLC cache size, the data written between the moment the first data block of the SLC cache is written and the maximum amount of data written before garbage collection is triggered is equal to the SLC cache size. This can be easily visualized in a case where the garbage collection follows a First In First Out policy. Memory components operating at the longest data dwell length have the highest data overwrite rate and are more desirable in terms of resource usage than memory components operating at lesser data dwell lengths. However, in an effort to select the data blocks with the least amount of valid data for garbage collection, some data blocks in the SLC cache can be overlooked and inadvertently left in the SLC cache without being garbage collected due to cold host data. Cold host data can refer to data that is not frequently used or modified by the host system (e.g., typically media files).

As more SLC cache data blocks are programmed with cold host data, these data blocks are not selected for garbage collection due to the cold host data of the data blocks including a higher amount of valid data when compared to the data of other data blocks. When a greedy garbage collection operation is used, the data blocks with cold host data are not garbage collected until the valid data of the other data blocks in the SLC cache is equal to or exceeds the amount of valid data stored in the data blocks with the cold host data. As a result, a portion of the SLC cache is "clogged". The number of SLC cache data blocks that are written with new host data is reduced. Accordingly, a smaller data dwell length of data that is consistently selected by the greedy garbage collection operation results in a smaller overwrite rate resulting in larger valid data than theoretically accomplished. The reduced overwrite rate of host data resulted by the smaller data dwell length can result in the data blocks of the memory components being used inefficiently. In some instances, throughput performance of the memory component can be reduced due to the inefficient use of the data blocks. Also, the longer data dwells (e.g., cold host data), the more likely the data is to become corrupted. Accordingly, techniques disclosed herein move cold host data upon determining a threshold condition has been satisfied.

Aspects of the present disclosure address the above and other deficiencies by having a memory sub-system that changes a type of a garbage collection operation that is to be performed for a SLC cache based on a threshold condition related to when the valid data was written to a data block. The data of the SLC cache can be garbage collected by relocating the valid data to data blocks having another memory type (e.g., TLC, MLC, QLC). The data blocks having the other memory type can be part of the same memory component as the SLC cache or can be part of a different memory component.

In some embodiments, host data can be initially programmed to the SLC cache. A garbage collection operation (e.g., a greedy garbage collection operation) can be performed to relocate valid data from a data block having the least amount of valid data in the SLC cache. The valid data can be copied to another data block having a different memory type. In some instances, the valid data and the invalid data in the data block of the SLC cache is not erased until the data successfully writes to the other data block. As noted above, some data blocks can be overlooked using the first garbage collection operation (e.g., a greedy garbage collection operation). Thus, in response to determining that a threshold condition associated with when valid data was written to the SLC cache, a second garbage collection operation (e.g., memory flush operation) can be performed to write valid data from the SLC cache to another data block based on when the valid data was written to the SLC cache. It should be understood that a greedy garbage collection operation and a memory flush operation are each a type of a garbage collection operation.

In some embodiments, an indicator can be used to determine when the threshold condition is satisfied. The number of other SLC cache blocks programmed in between when a data block is programmed with host data and when the data block is garbage collected can be used as an indicator. Every SLC cache data block that is newly opened to program host data is given an index value. The index value is incremented whenever a new SLC cache block is opened. The difference in index value of an SLC cache block and the index value of the latest open SLC cache block can be used as the dwell length indicator. For example, assume that an SLC data block is the first ever programmed data block in the life time of the memory component. Such an SLC data block can have an index assigned as 1. If the data written is an operating system (OS) image, this SLC data block can have 100% valid data since the host does not typically over-write the OS image. As the host writes additional data, more and more SLC data blocks can be newly opened to write host data. For each SLC data block opened, the index value is incremented and assigned to that block. Each SLC data block can have a unique index number. If there are 10 additional SLC data blocks opened and programmed, then the $10^{th}$ block has an index value of 11. At any time, the dwell length of an SLC data block can be computed by the difference of its index number and the highest index number of the SLC data blocks. A delta or difference between the largest index value (newest data) and the smallest index value (oldest data) for two respective data blocks can be determined. If the delta exceeds a threshold difference, then the threshold condition is satisfied. Alternatively, an index value can be treated as the sequence number in which SLC blocks are opened for programming.

In some embodiments, the smallest index value can be determined and an amount of data that has been written since the data stored at the data block associated with the smallest index was written can be determined. If the amount of data written subsequent to the data stored at the data block associated with the smallest index exceeds a threshold amount, the threshold condition is satisfied. In some embodiments, the indicator can be a timestamp and if more than a threshold amount of time has elapsed since the data of a data block associated with the timestamp was written, then the threshold condition is satisfied.

When the threshold condition is satisfied, the memory flush operation can be performed. The memory flush operation can include copying the valid data in the data block that satisfies the threshold condition to another data block and erasing the valid and invalid data from the data block that satisfies the threshold condition. In some embodiments, when the threshold condition is satisfied, the memory flush operation can include copying valid data from every data block in the static cache to another data block and erasing all of the valid and invalid data in the static cache to completely flush the static cache. In some instances, the oldest data can be selected for copying first to another data block and then released (e.g., erased). Then, the next oldest data block can be selected for copying to another data block and then released. Such a process can proceed until all valid data from all of the data blocks is moved from the static cache to the other data blocks.

Advantages of the present disclosure include, but are not limited to, an improved performance of the memory sub-system as data blocks of the static cache can be freed or made available to store host data at faster overwrite rates. That is, the present disclosure can eliminate cold host data clogs and increase the data dwell length. The elimination of the cold host data clogs and the increase in the data dwell length can improve the performance of the memory sub-system as the full size of the static cache can be utilized more efficiently. Additionally, improving the performance of the memory sub-system can result in energy savings. For example, performing the flushing operation can provide optimal operating dwell lengths for data in data blocks of the SLC cache. Optimal operating dwell lengths can result in lesser amounts of valid data in the data blocks of the SLC cache. Thus, he effort of moving data from the SLC cache to another memory component can be reduced by performing the flushing operation because smaller valid data during garbage collection consumes fewer MLC/TLC/QLC program-erase (P/E) cycles spent for garbage collection. Consuming fewer MLC/TLC/QLC program-erase (P/E) cycles for garbage collection can reduce energy consumption. As a result, the smaller MLC/TLC/QLC P/E cycle requirement for garbage collection operations can improve performance and/or reduce energy consumption.

FIG. 1 illustrates an example computing environment 100 that includes a memory sub-system 110 in accordance with some embodiments of the present disclosure. The memory sub-system 110 can include media, such as memory components 112A to 112N. The memory components 112A to 112N can be volatile memory components, non-volatile memory components, or a combination of such.

The characteristics of different types of media can be different from one media type to another media type. One example of a characteristic associated with a memory component is data density. Data density corresponds to an amount of data (e.g., bits of data) that can be stored per memory cell of a memory component. Using the example of a flash based memory, a quad-level cell (QLC) can store four bits of data while a single-level cell (SLC) can store one bit of data. Accordingly, a memory component including QLC memory cells will have a higher data density than a memory component including SLC memory cells.

Some types of memory components lack storage capacitors and can be subjected to data corruption in the event of a power loss while programming data to the memory component. For example, a TLC memory component can program data received from a host system using a two-pass programming operation. During a first pass, the data can be programmed to a first portion (e.g., a lower page) of the memory cells of the TLC memory component. During a second pass, the data can be programmed to a second portion (e.g., upper page, extra page) of the memory cells of the TLC memory component. If a power loss event occurs during the second pass, the data stored in the first portion of the memory cells can be corrupted.

In conventional systems, to address this issue, statically allocated reserved SLC data blocks of a memory component can be employed in addition to data blocks having the MLC, TLC, or QLC memory type. Data blocks having a memory type of SLC are immune to power loss events because they are programmed using a one-pass programming operation. In these conventional systems, host data can be mirrored between the SLC data blocks and the data blocks having the MLC, TLC, or QLC memory type. Data in the reserved SLC data blocks can be released after successfully writing all the pages to the other data blocks. In another example, only data that is to be written in the first pass of a two-pass programming operation is written to the reserved SLC data blocks. In yet another example, a static SLC cache can be used to route host data to the SLC data blocks first. After the static SLC cache is completely consumed, data from the SLC data blocks can be relocated to the data blocks having the MLC, TLC, or QLC memory type. Once completely relocated from the SLC data block to the other data blocks, the data in the SLC data block can be erased.

In some embodiments, the memory sub-system is a storage system. An example of a storage system is a SSD. In some embodiments, the memory sub-system 110 is a hybrid memory/storage sub-system. In general, the computing environment 100 can include a host system 120 that uses the memory sub-system 110. For example, the host system 120 can write data to the memory sub-system 110 and read data from the memory sub-system 110.

The host system 120 can be a computing device such as a desktop computer, laptop computer, network server, mobile device, or such computing device that includes a memory and a processing device. The host system 120 can include or be coupled to the memory sub-system 110 so that the host system 120 can read data from or write data to the memory sub-system 110. The host system 120 can be coupled to the memory sub-system 110 via a physical host interface. As used herein, "coupled to" generally refers to a connection between components, which can be an indirect communicative connection or direct communicative connection (e.g., without intervening components), whether wired or wireless, including connections such as electrical, optical, magnetic, etc. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components 112A to 112N when the memory sub-system 110 is coupled with the host system 120 by the PCIe interface. The physical host interface can provide an interface for passing control, address, data, and other signals between the memory sub-system 110 and the host system 120.

The memory components 112A to 112N can include any combination of the different types of non-volatile memory components and/or volatile memory components. An example of non-volatile memory components includes a negative-and (NAND) type flash memory. Each of the memory components 112A to 112N can include one or more arrays of memory cells such as single level cells (SLCs) or multi-level cells (MLCs) (e.g., triple level cells (TLCs) or quad-level cells (QLCs)). In some embodiments, a particular memory component can include both an SLC portion and a MLC portion of memory cells. For example, the SLC portion can be the static cache discussed above that is used to initially write host data to the memory component. The garbage collection operation can initially be performed on the data of the data blocks of the SLC portion based on an amount of valid data of the data blocks. After a threshold condition is satisfied, the garbage collection operation can be performed on the data of the data blocks of the SLC portion based on when the valid data was written to the data blocks to efficiently use the data blocks of the SLC portion to enhance performance of the memory sub-system 110. In some embodiments, a first memory component 112A can include data blocks having a SLC memory type and a second memory component 112N can include data blocks having another memory type (e.g., MLC, TLC, QLC, etc.). The first memory component 112A can be used as a cache to initially stored host data and the garbage collection operation can be performed on the data of the data blocks of the first memory component 112A to relocate the data to data blocks of the second memory component 112N.

Each of the memory cells can store one or more bits of data (e.g., data blocks) used by the host system 120. Although non-volatile memory components such as NAND type flash memory are described, the memory components 112A to 112N can be based on any other type of memory such as a volatile memory. In some embodiments, the memory components 112A to 112N can be, but are not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. Furthermore, the memory cells of the memory components 112A to 112N can be grouped as memory pages or data blocks that can refer to a unit of the memory component used to store data.

The memory system controller 115 (hereinafter referred to as "controller") can communicate with the memory components 112A to 112N to perform operations such as reading data, writing data, or erasing data at the memory components 112A to 112N and other such operations. The controller 115 can include hardware such as one or more integrated circuits and/or discrete components, a buffer memory, or a combination thereof. The controller 115 can be a microcontroller, special purpose logic circuitry (e.g., a field programmable gate array (FPGA), an application specific integrated circuit (ASIC), etc.), or other suitable processor. The controller 115 can include a processor (processing device) 117 configured to execute instructions stored in local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120. In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 may not include a controller 115, and may instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory components 112A to 112N. The controller 115 can be responsible for other operations such as wear leveling operations, garbage collection operations, error detection and error-correcting code (ECC) operations, encryption operations, caching operations, and address translations between a logical block address and a physical block address that are associated with the memory components 112A to 112N. The controller 115 can further include host interface circuitry to communicate with the host system 120 via the physical host interface. The host interface circuitry can convert the commands received from the host system into command instructions to access the memory components 112A to 112N as well as convert responses associated with the memory components 112A to 112N into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory components 112A to 112N.

The memory sub-system 110 includes a garbage collection component 113 that can be used to perform garbage collection on data stored at the memory components 112A-112N. In some embodiments, the controller 115 includes at least a portion of the garbage collection component 113. For example, the controller 115 can include a processor 117 (processing device) configured to execute instructions stored in local memory 119 for performing the operations described herein. In some embodiments, the garbage collection component 113 is part of the host system 110, an application, or an operating system.

The garbage collection component 113 can perform a garbage collection operation based on an amount of valid data of each data block of a memory component 112A having a particular memory type (e.g., SLC), and can switch a priority of which data blocks are subject to the garbage collection operation from being based on an amount of valid data stored at the data blocks to be based on a threshold condition associated with when the valid data was written to the data blocks of the memory component 112A. The garbage collection component 113 can remove any clogs in the data blocks of the memory component 112A by relocating any cold host data that is not being relocated using the garbage collection operation based on the amount of valid data stored at the data blocks. Further details with regards to the operations of the garbage collection component 113 are described below.

Figure 2:
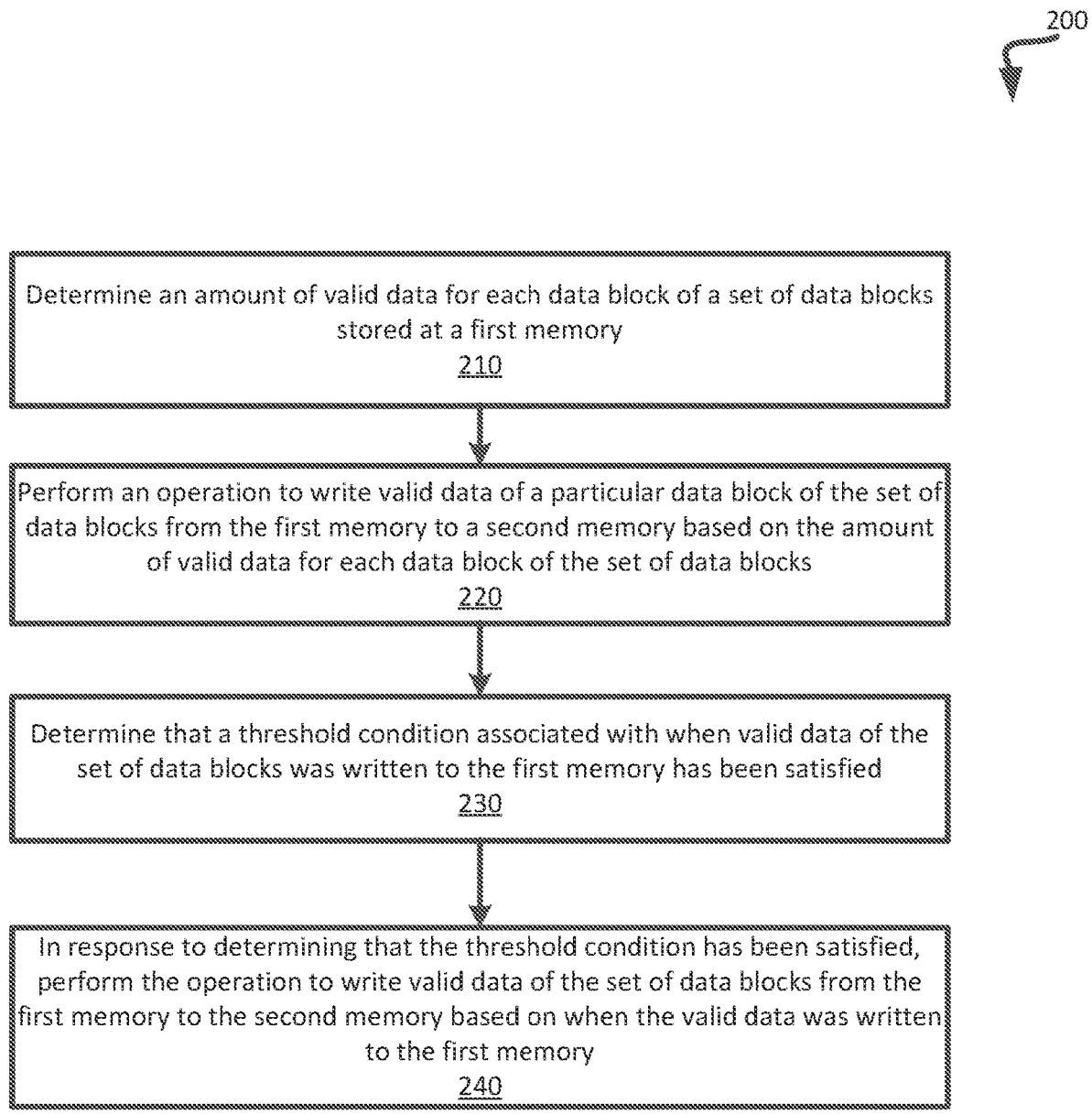
FIG. 2 is a flow diagram of an example method to perform an operation to move valid data from a first memory to a second memory based on the amount of valid data and performing the operation to move the valid data from the first memory to the second memory based on when the valid data was written to the first memory in accordance with some embodiments of the present disclosure.

FIG. 2 is a flow diagram of an example method 200 to perform an operation to move valid data from a first memory to a second memory based on the amount of valid data and performing the operation to move the valid data from the first memory to the second memory based on when the valid data was written to the first memory, in accordance with some embodiments of the present disclosure. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the garbage collection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 210, the processing device determines an amount of valid data for each data block of a set of data blocks stored at a first memory (e.g., memory component 112A). The valid data can be data that is successfully written to a data block and has not been erased, indicated to be erased, updated, or re-programmed by a host system. The first memory can have a memory type that is programmed using a one-pass programming operation (e.g., programs the data after one voltage pulse is applied), such as SLC.

At block 220, the processing device performs an operation (e.g., a garbage collection operation) to write valid data of a particular data block of the set of data blocks from the first memory to a second memory (e.g., memory component 112N, or different data blocks in the memory component 112A) based on the amount of valid data for each data block of the set of data blocks. The second memory can be a memory type that is programmed using a two-pass programming operation (e.g., a first portion of data is programmed in a first pass and the rest of the data is programmed in a second pass), such as MLC, TLC, or QLC. The data block storing the least amount of valid data can be selected and the valid data from the selected data block can be written to another data block of the second memory. The processing device can determine that the valid data is successfully written to the second memory (e.g., either completing the two-pass programming operation, or completing a suitable percentage of the two-pass programming operation). Responsive to the determination that the valid data is successfully written to the second memory, the processing device can erase the valid data and the invalid data from the respective data block at the first memory.

As discussed above, using a priority related to the amount of valid data stored at the data blocks to perform the operation can result in some valid data (e.g., a data block including a highest amount of valid data) not being copied to the second memory and can reduce the number of data blocks that are overwritten in the first memory. Thus, in some embodiments, the priority of which data blocks are to be subjected to the operation is switched based on a threshold condition associated with when valid data of the set of data blocks of the first memory was written.

For example, at block 230, the processing device determines that a threshold condition associated with when valid data of the set of data blocks was written to the first memory has been satisfied. In some embodiments, determining that the threshold condition associated with when valid data of the set of data blocks was written to the first memory has been satisfied includes identifying an indicator associated with when a last data block (e.g., newest data) was written to the first memory. The indicator can be an index value (e.g., version number) that begins at 0 or 1 and is incremented each time the data block is programmed. The processing device can also identify a second indicator associated with when a first data block (e.g., oldest data) was written to the first memory. The threshold condition can correspond to a difference between when the last data block was written to the first memory in view of the indicator relative to when the first data block (or oldest data block presently stored at the first memory) was written to the first memory in view of the second indicator (e.g., compares the index values), and the threshold condition is satisfied when the difference exceeds a threshold difference.

In some embodiments, determining that the threshold condition associated with when valid data of the set of data blocks was written to the first memory has been satisfied includes the processing device identifying an indicator associated with when a first data block (e.g., oldest data) was written to the first memory. In this embodiment, the indicator can be an index value, a timestamp, or flag, etc. The processing device can determine whether an amount of data written to other data blocks of the first memory since the data was written to the first data block of the first memory exceeds the threshold condition. The threshold condition can be satisfied when the amount of data written to the other data blocks since the data was written to the first data block exceeds a threshold amount.

In some embodiments, determining that the threshold condition associated with when valid data of the set of data blocks was written to the first memory has been satisfied includes identifying an indicator associated with when a first data block (e.g., oldest data) of the data blocks that are currently stored at the first memory. In this embodiment, the indicator can be a timestamp. The processing device can determine, in view of the timestamp, whether an amount of elapsed time since the data was written to the first data block exceeds the threshold condition. The threshold condition can be satisfied when the amount of elapsed time since the data was written to the first data block exceeds a threshold amount of elapsed time.

At block 240, in response to determining that the threshold condition has been satisfied, the processing device performs the operation (e.g., the garbage collection operation) to write valid data of the set of data blocks from the first memory to the second memory based on when the valid data was written to the first memory. It should be noted that, when the threshold condition is satisfied, the garbage collection strategy can be switched from selecting the data block with the least valid data to selecting the data block with the oldest valid data. In some embodiments, the processing device can start writing the oldest valid data to the second memory and erasing the oldest valid data in the first memory after successfully being written to the second memory. Then, the processing device can write the next oldest valid data to the second memory and erase the next oldest valid data in the first memory after successfully being written to the second memory. This process can continue until all valid data is flushed from the first memory. In some embodiments, just a portion of the valid data can be flushed. For example, any valid data in data blocks that have an index value that exceeds a threshold delta with the index value of the data block associated with the newest valid data, any valid data in data blocks that were written more than a threshold amount of elapsed time, and so forth can be flushed. In this way, just the "clogged" data blocks are flushed.

Figure 3A:
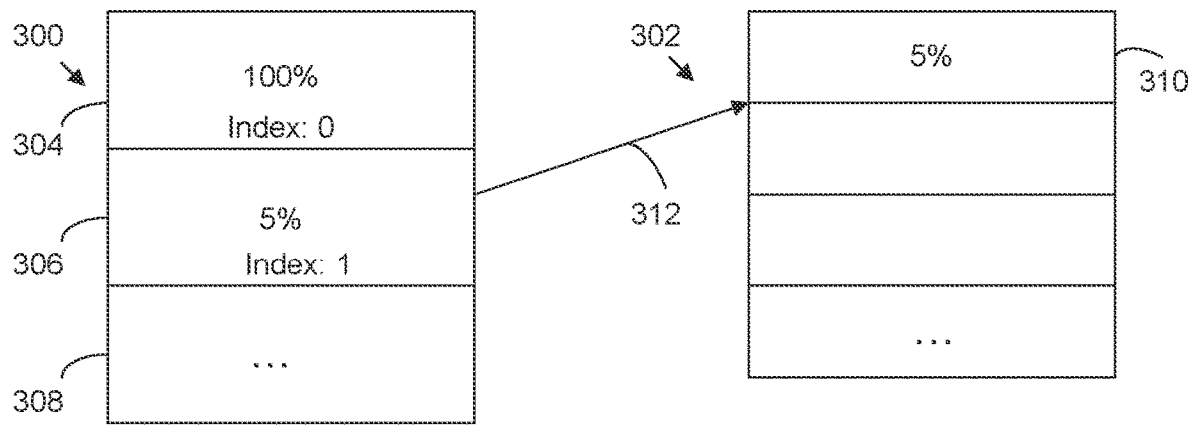
FIG. 3A illustrates an example of performing an operation to move data from a first memory to a second memory based on the amount of valid data in accordance with some embodiments of the present disclosure.

FIG. 3A illustrates an example of performing an operation to move data from a first memory 300 to a second memory 302 based on the amount of valid data in accordance with some embodiments of the present disclosure. The host system 120 can send data to the memory sub-system 110 to be stored. The first memory 300 can be static cache of reserved data blocks 304, 306, 308 and can have a memory type (e.g., SLC) that is programmed using a one-pass programming operation. The second memory 302 can have a memory type (e.g., MLC, TLC, QLC) that is programmed using a two-pass programming operation. The data from the host can be written to the first memory 300 first using the one-pass programming operation to ensure that the data is not corrupted when written to the second memory 302 from a power loss during the two-pass programming operation. The first memory 300 and the second memory 302 can be different portions of the same memory component 112A or of different memory components 112A and 112N.

As depicted, the first memory 300 includes two data blocks 304 and 306 with differing amounts of valid data stored therein. Data block 304 stores 100% valid data and data block 306 stores 5% valid data. A processing device can perform an operation (e.g., garbage collection) to write the valid data of a particular data block from the first memory 300 to the second memory 302 based on the amount of valid data for each data block 304 and 306. In some instances, the processing device selects the least amount of valid data in the data blocks 304 and 306 of the first memory 300. Thus, the processing device selects the 5% of valid data from data block 306 to write to a data block 310 of the second memory 302, as depicted by arrow 312. Although 5% valid data is shown as written to block 302 of the second memory 302 for simplicity, it should be noted that if the second memory 302 is of type MLC, then 2.5% valid data would be written because the MLC data block is twice the size of the SLC data block. Similarly, if the data block 302 is of type TLC, then 1.67% would be written because the TLC data block is three times the size of the SLC data block, and if the data block 302 is of type QLC, then 1.25% valid data would be written because the QLC data block is four times the size of the SLC data block.

Further, as depicted, an index value is associated with each data block of the first memory 300 when the data blocks are programmed. It should be understood that the index value is used as an example of an indicator and there are other indicators that can be used (e.g., timestamps, amount of data written, etc.). The processing device can associate the index value having an initial value to the data block that is initially programmed and increment the index value each time a data block is programmed. Accordingly, the index value for the data block 304 that is initially programmed is 0 and the index value for the data block 306 is incremented once to 1. After the processing device determines that the 5% valid data is written successfully to the data block 310, the 5% valid data can be erased from the data block 306 of the first memory 300.

Figure 3B:
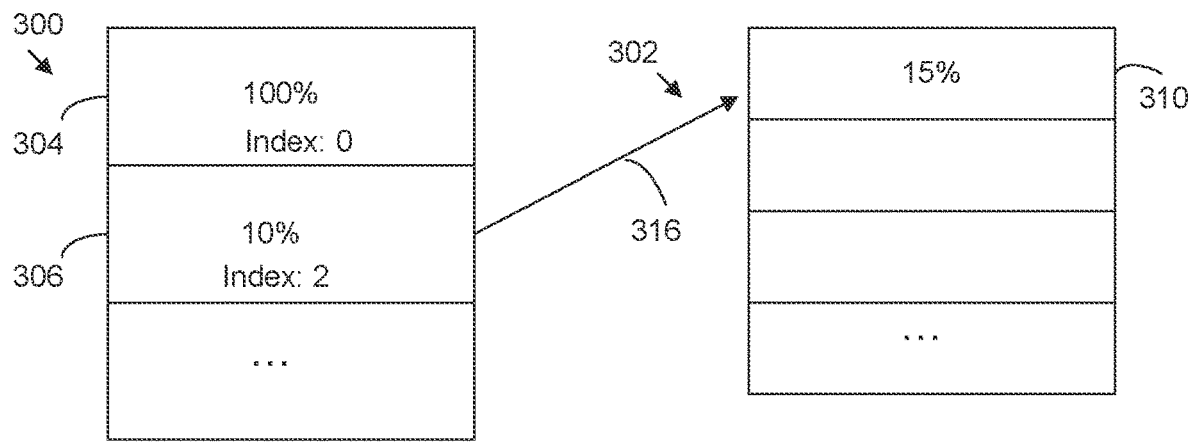
FIG. 3B illustrates another example of performing an operation to move data from a first memory to a second memory based on the amount of valid data in accordance with some embodiments of the present disclosure.

FIG. 3B illustrates another example of performing an operation to move data from the first memory 300 to the second memory 302 based on the amount of valid data in accordance with some embodiments of the present disclosure. As depicted, the first memory 300 includes two data blocks 304 and 306 with differing amounts of valid data stored therein. Data block 304 stores 100% valid data and data block 306 stores 10% valid data. A processing device can perform an operation (e.g., garbage collection) to write the valid data of a particular data block from the first memory 300 to the second memory 302 based on the amount of valid data for each data block 304 and 306. In some instances, the processing device selects the least amount of valid data in the data blocks 304 and 306 of the first memory 300. Thus, the processing device selects the 10% from data block 306 to write to the data block 310 by combining the 10% with the previously stored 5% to result in 15% valid data at the data block 310 of the second memory 302, as depicted by arrow 316.

Further, as depicted, the index value for the data block 306 is incremented again to 2 because it was reprogrammed with the 10% valid data. The index value for the data block 304 remains at 0 because it has only been programmed once.

After the processing device determines that the 10% valid data is written successfully to the data block 310, the 10% valid data can be erased from the data block 306 of the first memory 300. It should be understood that the 100% valid data in the data block 304 remains stored at the data block 304 after the second operation performs because it included more valid data than the 5% valid data and the 10% valid data of the data block 306. In some instances, data block 306 can continue to be programmed with less valid data than data block 304 and data block 304 can be clogged with cold host data.

Figure 3C:
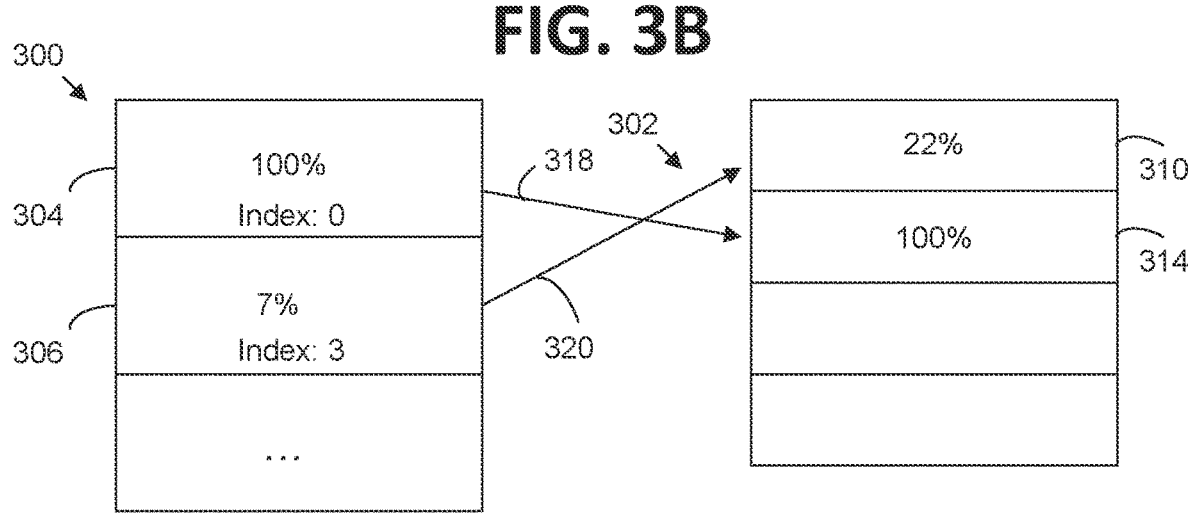
FIG. 3C illustrates an example of selecting blocks on which to perform a garbage collection operation based on when the valid data was written to the first memory in accordance with some embodiments of the present disclosure.

Thus, embodiments of the present disclosure provide for switching the priority of which data blocks are subjected to the operation from being based on an amount of valid data of the data blocks of the first memory 300 to be based on a threshold associated with when the valid data was written to the data blocks of the first memory 300. For example, FIG. 3C illustrates an example of selecting blocks on which to perform a garbage collection operation based on when the valid data was written to the first memory 300 in accordance with some embodiments of the present disclosure. After the 10% valid data was written to the second memory 302 and erased from the first memory 300 in FIG. 3B, the data block 306 is written with 7% valid data. The index value for the data block 306 is incremented a third time to 3 in response to being programmed with the 7% data.

The processing device can determine that a threshold condition associated with when valid data of the set of data blocks was written to the first memory 300 has been satisfied by identifying an indicator associated with when a last data block was written to the first memory 300. In the depicted example, the indicator is the index value associated with the data block 306 and the last data block that was written is the data block 306 because it has the highest index value of 3. The processing device can identify a second indicator associated with when a first data block was written to the first memory 300. In the depicted example, the second indicator is the index value associated with the data block 304 and the first data block that was written to the first memory 300 is the data block 304 because it has the lowest index value. The threshold condition corresponds to a difference between when the last data block 306 was written to the first memory 300 relative to when the first data block 304 was written to the first memory 300. The threshold condition is satisfied when the difference exceeds a threshold difference. In the depicted example, the threshold difference is 2 and the delta between the index value (3) of the last data block 306 and the index value (0) of the first data block 304 is 3. Thus, the threshold difference is exceeded.

In response to determining that the threshold condition has been satisfied, the processing device can perform the operation to write the valid data of the set of data blocks 304 and 306 to the second memory 302 based on when the valid data was written to the first memory. For example, the processing device can write the oldest valid data to the second memory 302 first. The oldest valid data can be identified by the data block having the lowest index value (e.g., data block 304 has index value of 0). As depicted by arrow 318, the oldest valid data (e.g., 100% valid data) of the data block 304 is written to data block 314 of the second memory 302. In some embodiments, at least a portion of the oldest valid data of the data block 304 can be appended to block 310. For example, a policy can be implemented that mixes the least valid data from data block 306 having index 1 in FIG. 3A, data block 306 having index 2 in FIG. 3B, and data block 306 having index 3 in FIG. 3B in data block 310. For example, data block 310 can be designated for a data meeting a certain criterion, such as least valid data, and another data block (e.g., data block 314) that is opened for data meeting another criterion, such as a certain age threshold.

In some embodiments, after the oldest valid data of the data block 304 is written to data block 314 of the second memory 302, the next oldest valid data (e.g., 7% valid data) of the data block 306 can be written to data block 310 and combined with the previous 15% valid data (resulting in 22%) of the second memory 302, as depicted by arrow 320. Data blocks 304 and 306 can be erased of any data upon determining that the valid data successfully wrote to the second memory 302.

Figure 4:
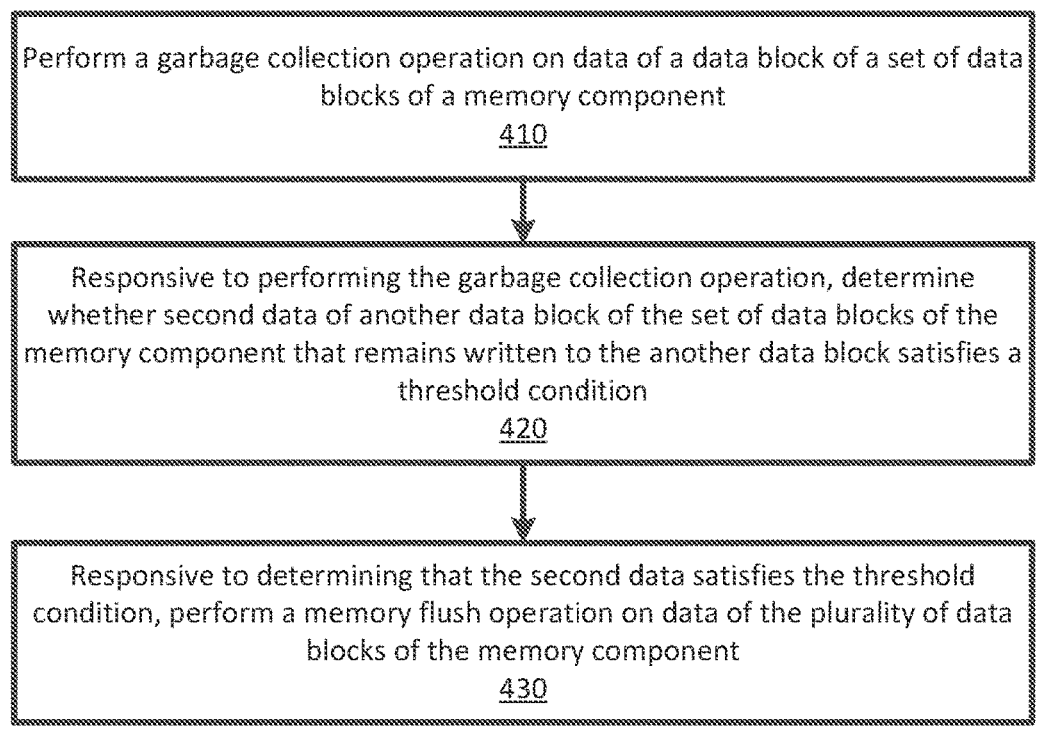
FIG. 4 is a flow diagram of an example method to perform a different garbage collection operation based on different priorities in accordance with some embodiments of the present disclosure.

FIG. 4 is a flow diagram of an example method 400 to perform a garbage collection operation based on different priorities, in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the garbage collection component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At block 410, the processing device performs a garbage collection operation on data of a data block of a set of data blocks of a memory component 112A. The memory component 112A can be a cache that has a memory type that is programmed using a one-pass programming operation (e.g., SLC). Host data can be initially written to the memory component 112A before being relocated to another portion of the memory component 112A or to a different memory component 112N. The garbage collection operation select data blocks based on a priority associated with an amount of valid data being stored at each data block of the set of data blocks. The garbage collection operation can select a data block having a least amount of valid data from the set of data blocks and write the valid data from the selected data block to another data block of the memory component 112A or of a different memory component 112N. Further, the garbage collection operation can erase the valid data from the data block of the memory component 112A after the valid data is successfully written.

At block 420, responsive to performing the garbage collection operation, the processing device determines whether second data of another data block of the set of data blocks of the memory component 112A that remains written to the another data block satisfies a threshold condition. The processing device switches priority of which data blocks on which to perform the operation from being based on the amount of valid data stored at the set of data blocks to being based on when the valid data was written to the set of data blocks. In some embodiments, to determine whether the second data of the another data block of the set of data blocks of the memory component 112A that remains written to the another data block after the garbage collection operation is performed satisfies the threshold condition, the processing device can identify whether a delta between an indicator associated with the another data block and a second indicator associated with any of the remaining set of data blocks exceeds a threshold value. For example, the processing device can compare an index value of the another data block with the index value of a newest data block that was written with data. If the delta is more than a threshold difference between the index values, the processing device can determine that the threshold condition is satisfied.

In some embodiments, to determine whether the second data of the another data block of the set of data blocks of the memory component 112A that remains written to the another data block after the garbage collection operation is performed satisfies the threshold condition, the processing device can identify whether an amount of data written to the set of data blocks since the second data was written to the another data block exceeds a threshold value. For example, the processing device can identify an indicator associated with the another data block and can determine the amount of data written to other data blocks of the memory component 112A after the data was written to the another data block. If more than a threshold amount of data has been written, the threshold condition is satisfied.

In some embodiments, to determine whether the second data of the another data block of the set of data blocks of the memory component 112A that remains written to the another data block after the garbage collection operation is performed satisfies the threshold condition, the processing device can identify whether an amount of elapsed time since the second data was written to the another data block exceeds a threshold value. If the amount of elapsed time since the second data was written to the another data block exceeds the threshold value, then the threshold condition can be satisfied.

At block 430, responsive to determining that the second data satisfies the threshold condition, the processing device performs a memory flush operation on data of the set of data blocks of the memory component. The memory flush operation can refer to a type of garbage collection that uses a priority for data blacks on which to execute based on when valid data was written to the data blocks. To perform the memory flush operation on the data of the set of data blocks of the memory component 112A, the processing device can write each of the data of the set of data blocks to another memory component 112N or another data block of the memory component 112A, and erase each of the data from the set of data blocks of the memory component 112A. In some embodiments, the processing device can select the oldest valid data from the set of data blocks of the memory component 112A and work backwards copying the valid data to the other memory component 112N oldest to newest. After each of the valid data is copied to a new location, the valid data can be erased from the set of data blocks.

Figure 5:
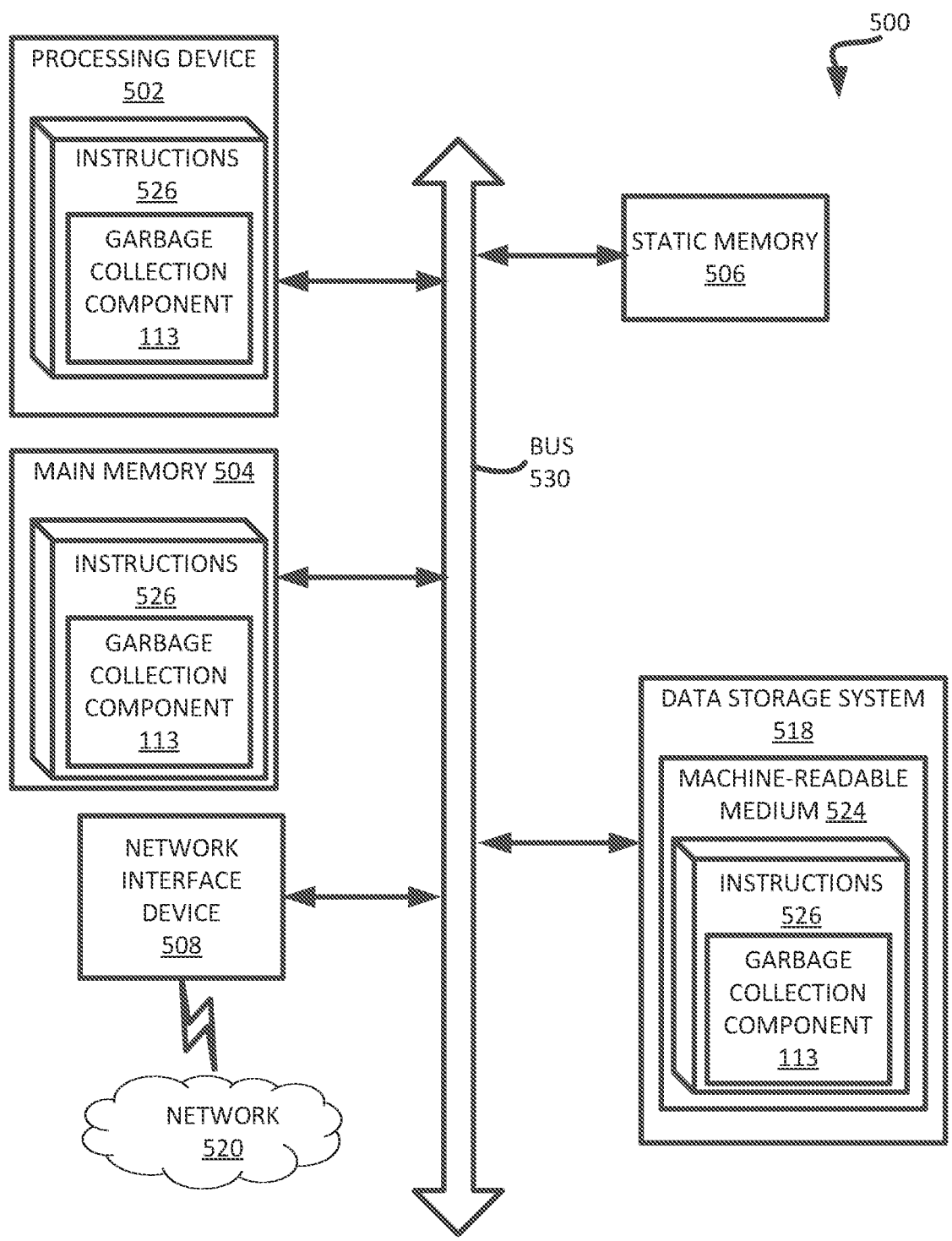
FIG. 5 is a block diagram of an example computer system in which embodiments of the present disclosure may operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to the garbage collection component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a garbage collection component (e.g., the garbage collection component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   initiating, by a processing device, a process to write valid data of at least a first block of a plurality of blocks stored at a first memory to a second memory, wherein the first memory has a first memory type and the second memory has a second memory type different from the first memory type;
   identifying, by the processing device, at least one indicator relating to when data was written to the plurality of blocks stored at the first memory;
   determining, by the processing device, whether an age of the valid data of the first block exceeds a threshold age based on the at least one indicator; and
   in response to determining that the age of the valid data of the first block exceeds the threshold age, writing, by the processing device, the valid data of the first block to the second memory.

2. The method of claim 1, wherein the at least one indicator comprises:
   a first indicator associated with when a last block maintaining newest valid data of the plurality of blocks was written to the first memory; and
   a second indicator associated with when an initial block maintaining oldest valid data of the plurality of blocks was written to the first memory; and
   wherein determining whether the age of the valid data of the block exceeds the threshold age comprises determining whether a difference in time between when the last block was written to the first memory relative to when the initial block was written to the first memory exceeds a threshold difference.

3. The method of claim 1, wherein the at least one indicator comprises an indicator associated with an initial time when an initial block of the plurality of blocks was written to the first memory, and wherein determining whether the age of the valid data of the first block exceeds the threshold age comprises determining whether an amount of data written to other blocks of the plurality of blocks since the initial time exceeds a threshold amount of data.

4. The method of claim 1, wherein the at least one indicator comprises an indicator associated with an initial time when an initial block of the plurality of blocks was written to the first memory, and wherein determining whether the age of the valid data of the block exceeds the threshold age comprises determining whether an amount of elapsed time since the initial time exceeds a threshold amount of elapsed time.

5. The method of claim 1, wherein the valid data of the first block is data that has not been erased, indicated to be erased, updated, or re-programmed by a host system.

6. The method of claim 1, wherein writing the valid data of the first block from the first memory to the second memory further comprises:
   determining that the valid data of the first block is successfully written to the second memory; and
   responsive to determining that the valid data of the first block is successfully written to the second memory, erasing the valid data of the first block from the first memory.

7. The method of claim 1, wherein the valid data of the first block is written from the first memory to the second memory based on the first block storing a least amount of valid data relative to other blocks of the plurality of blocks.

8. The method of claim 1, wherein the first memory comprises a single level cell memory, and the second memory comprises a multi-level cell memory, a triple level cell memory, or a quad level cell memory.

9. A non-transitory computer-readable storage medium comprising instructions that, when executed by a processing device, cause the processing device to perform operations comprising:
   initiating a process to write valid data of at least a first block of a plurality of blocks stored at a first memory to a second memory, wherein the first memory has a first memory type and the second memory has a second memory type different from the first memory type;
   identifying at least one indicator relating to when data was written to the plurality of blocks stored at the first memory;
   determining whether an age of the valid data of the first block exceeds a threshhold age based on at least one indicator; and
   in response to determining that the age of the valid data of the first block exceeds the threshold age, writing the valid data of the first block to the second memory.

10. The non-transitory computer-readable storage medium of claim 9, wherein the at least one indicator comprises:
    a first indicator associated with when a last block maintaining newest valid data of the plurality of blocks was written to the first memory; and
    a second indicator associated with when an initial block maintaining oldest valid data of the plurality of blocks was written to the first memory; and
    wherein determining whether the age of the valid data of the block exceeds the threshold age comprises determining whether a difference in time between when the last block was written to the first memory relative to when the initial block was written to the first memory exceeds a threshold difference.

11. The non-transitory computer-readable storage medium of claim 9, wherein the at least one indicator comprises an indicator associated with an initial time when an initial block of the plurality of blocks was written to the first memory, and wherein determining whether the age of the valid data of the first block exceeds the threshold age comprises determining whether an amount of data written to other blocks of the plurality of blocks since the initial time exceeds a threshold amount of data.

12. The non-transitory computer-readable storage medium of claim 9, wherein the at least one indicator comprises an indicator associated with an initial time when an initial block of the plurality of blocks was written to the first memory, and wherein determining whether the age of the valid data of the first block exceeds the threshold age comprises determining whether an amount of elapsed time since the initial time exceeds a threshold amount of elapsed time.

13. The non-transitory computer-readable storage medium of claim 9, wherein the valid data of the first block is data that has not been erased, indicated to be erased, updated, or re-programmed by a host system.

14. The non-transitory computer-readable storage medium of claim 9, wherein writing the valid data of the first block from the first memory to the second memory further comprises:

determining that the valid data of the first block is successfully written to the second memory; and responsive to determining that the valid data of the first block is successfully written to the second memory, erasing the valid data of the first block from the first memory.

15. The non-transitory computer-readable storage medium of claim 9, wherein the valid data of the first block is written from the first memory to the second memory based on the first block storing a least amount of valid data relative to other blocks of the plurality of blocks.

16. The non-transitory computer-readable storage medium of claim 9, wherein the first memory comprises a single level cell memory, and the second memory comprises a multi-level cell memory, a triple level cell memory, or a quad level cell memory.

17. A system comprising:

a first memory having a first memory type;

a second memory having a second memory type different from the first memory type; and a processing device, operatively coupled with the first memory and the second memory, to perform operations comprising:

initiating a process to write valid data of a first block of a plurality of blocks of the first memory to the second memory;

identifying at least one indicator relating to when data was written to the plurality of blocks stored at the first memory;

determining whether an age of the valid data of the first block exceeds a threshold age based on the at least one indicator; and in response to determining that the age of the valid data of the first block exceeds the threshold age, writing the valid data of the first block to the second memory.

18. The system of claim 17, wherein the at least one indicator comprises at least one of:

a first indicator associated with when a last block maintaining newest valid data of the plurality of blocks was written to the first memory; or a second indicator associated with an initial time when an initial block maintaining oldest valid data of the plurality of blocks was written to the first memory; and wherein determining whether the age of the valid data of the first block exceeds the threshold age comprises at least one of:

determining whether a difference in time between when the last block was written to the first memory relative to when the initial block was written to the first memory exceeds a threshold difference;

determining whether an amount of data written to other blocks of the plurality of blocks since the initial time exceeds a threshold amount of data; or determining whether an amount of elapsed time since the initial time exceeds a threshold amount of elapsed time.

19. The system of claim 17, wherein: the valid data of the first block is data that has not been erased, indicated to be erased, updated, or re-programmed by a host system; and the valid data of the first block is written to the second memory based on the first block storing a least amount of valid data relative to other blocks of the plurality of blocks.

20. The system of claim 17, wherein the first memory comprises a single level cell memory, and the second memory comprises a multi-level cell memory, a triple level cell memory, or a quad level cell memory.

* * * * *